United States Patent [19]

Evans

[11] Patent Number: 4,553,145
[45] Date of Patent: Nov. 12, 1985

[54] METHOD OF FORMING THE FAR-FIELD BEAM PATTERN OF AN ANTENNA

[75] Inventor: Gary E. Evans, Trappe, Md.

[73] Assignee: Westinghouse Electric Corp., Pittsburgh, Pa.

[21] Appl. No.: 575,643

[22] Filed: Jan. 31, 1984

[51] Int. Cl.$^4$ .............................................. H01Q 3/00
[52] U.S. Cl. ..................................... 343/360; 343/703
[58] Field of Search ........................ 343/351, 360, 703

[56] References Cited

U.S. PATENT DOCUMENTS

| 3,879,733 | 4/1975 | Hansen et al. | 343/360 |
| 4,201,987 | 5/1980 | Tricoles et al. | 343/703 |
| 4,453,164 | 6/1984 | Patton | 343/360 |
| 4,468,669 | 8/1984 | Wang et al. | 343/703 |

Primary Examiner—Theodore M. Blum
Attorney, Agent, or Firm—W. E. Zitelli

[57] ABSTRACT

A method of forming the far-field beam pattern of an antenna at short ranges is disclosed. More specifically, the antenna beam pattern is rotated through a rotational angle about the line-of-sight of a source of radar signalling located at a near-field range away from the antenna. Measurements of the field of the antenna are taken at predetermined angular increments during the rotation thereof. The far-field beam pattern of the antenna is formed by deriving discrete values thereof for corresponding angle increments along the angular rotation. Preferably, a multiplicity of antenna field measurements are selected about each selected angular increment based on a predetermined angular spacing. The discrete beam pattern value corresponding to each selected angular increment is derived as the weighted summation of the multiplicity of antenna field measurements associated therewith. The derivation of each discrete beam pattern value may be performed substantially as the antenna field measurements are taken during the rotation of the antenna.

7 Claims, 9 Drawing Figures

METHOD OF FORMING THE FAR-FIELD BEAM PATTERN OF AN ANTENNA

BACKGROUND OF THE INVENTION

The present invention is related to methods of determining the beam pattern of an antenna, and more particularly to a method of forming the far-field beam pattern of the antenna from antenna field measurements taken at short ranges by deriving discrete values of the beam pattern for corresponding angle increments along an angular rotation, each discrete value being derived as a function of a multiplicity of antenna field measurements taken about the angle increment corresponding thereto.

FIG. 1 is an illustration of an exemplary site for testing radar antennas. The antenna 10 under test may be coupled to a rotating pedestal 12 which causes rotation of the antenna 10. Both assemblies 10 and 12 may be mounted on a structure 14 which may be a test building, for example, to render the antenna 10 elevated above the ground surface 16 a dimension e1. The structure 14 may be situated at one end 18 of a strip of land 20. At the opposite end 22 of the land strip 20 may be situated a transmitting antenna 24, for example, for transmitting radar signaling having a carrier wavelength $\lambda$ along a line-of-sight 26 to the antenna 10 under test. The transmitting antenna 24 is located at a finite range R away from the antenna 10 as measured along the line-of-sight 26. The antenna beam pattern of the antenna 10 may be rotated through a rotational angle about the line-of-sight for a collection of antenna field measurements for use in determining the far-field beam pattern of the antenna 10.

Typical apparatus used for the aforementioned determination is shown in the block diagram schematic of FIG. 2. Referring to FIG. 2, the radar signaling received by the antenna system 10 is provided to a conventional radar receiver 30 via rotating pedestal 12 and signal line 32. The receiver 30 conditions the signaling to provide amplitude A and phase $\phi$ signals to a recording device 34, which may be a strip chart recorder, for example. The recorder 34 may be synchronized to the rotation of the antenna 10 utilizing a sync signal 36. In addition, the amplitude A and phase $\phi$ signals along with a signal representative of the antenna pedestal position may be digitized in a conventional analog-to-digital (A/D) converter 38. The digitized signals 40 may be provided to a programmed digital computer 42 for processing to determine the far-field beam pattern of the antenna 10.

In general, antennas are designed to operate ideally with planar phase fronts. But, because the antennas are tested with finite ranges R, curved phase fronts are actually produced which result in an error near the main beam. For conventional antennas, the accepted range length requirement is $R > 2D^2/\lambda$, which produces a maximum phase error of 22.5° across the diameter D of the antenna with a wavelength $\lambda$. The effect of the curved phase front, in turn, typically causes a broadening of the base of the main beam. For ultra-low side lobe antennas, the recommended range is $4D^2/\lambda$. These recommended range sizes may be unavailable and at times undesirable, especially for an ultra-low side lobe antenna, since the larger the range, the more difficult it is to eliminate reflections. For example, a 40-foot L-band ultra-low side lobe antenna calls for a 1½ mile range with all reflections down 60 dB.

Presently, much attention is being given to testing the antennas at much shorter ranges than those recommended for far-field beam pattern determinations. These shorter ranges are commonly referred to as near-field ranges. One known test method used to convert near-field test measurements into the desired far-field beam pattern of the antenna performs the operation with matrix manipulations. In this method, the antenna 10 is rotated through an angular arc, which may be on the order of 20°, for example, and may include as many as 100 angle increments for which antenna field measurements may be taken. The angle increments and antenna field measurements, i.e. amplitude A and phase $\phi$, are digitized in the A/D converter 38 and provided to the digital computer 42 over signal lines 40. The collection of the antenna field measurements forms the near-field range antenna beam pattern $V_R(\theta)$.

It has been determined that if the range length is not too short, the angular beam pattern and the aperture distribution across the antenna are naturally related by a Fourier transformation. However, it is necessary to collect all of the antenna field measurement data taken over the angular rotation before the transformation can be performed. According to this method, the digital computer 42 may be programmed to transform the near-field pattern $V_R(\theta)$ to an effective distribution $f(x)$. Thereafter, the phase curvature effects are removed to obtain the actual distribution $g(x)$. An inverse Fourier transformation is then performed on $g(x)$ to obtain the desired far-field antenna beam pattern $V_\infty(\theta)$. The aforementioned transformations function well but involve very time consuming and costly computer manipulations. For example, for 100 angular incremental samples, the digital computer 42 must simultaneously solve 100 equations in both $\theta$ and x which involves processing a 100-by-100 matrix for each of the two transformations.

In view of the above, it would seem completely desirable to avoid the complexity in calculations for determining the far-field antenna beam pattern with shorter-range field measurements for the reason that they are so time consuming, especially on smaller computers. A method which uses various approximations at reasonable ranges in the determination of the far-field antenna beam pattern is proposed to eliminate the onerous transformations presently performed. In addition, a method which results in forming the far-field antenna beam pattern substantially during the taking of the shorter-field measurements would be additionally desirable.

SUMMARY OF THE INVENTION

In accordance with the present invention, the far-field beam pattern of an antenna is determined from antenna field measurements taken at a shorter range. The antenna is caused to receive radar signalling having a carrier wavelength $\lambda$ from a source located at a short range R away from the antenna. The antenna beam pattern is rotated through a rotational angle about the line-of-sight of the source of the radar signalling. Measurements of the field of the antenna are taken at predetermined angular increments during the rotation thereof. The far-field beam pattern of the antenna is formed by deriving discrete values thereof for corresponding angle increments along the angular rotation. Each discrete value is derived as a function of a multiplicity of antenna field measurements taken about the angle increment corresponding thereto.

In one embodiment, the far-field beam pattern of the antenna is formed during the angular rotation of the antenna, preferably by deriving the discrete values thereof substantially at the angle increments corresponding thereto during the rotation. More specifically, the angle increments are selected based on an angular spacing which is a function of the carrier wavelength $\lambda$ and the range R. The multiplicity of antenna field measurements used in the derivation of each discrete value of the beam pattern are selected about the angular increment corresponding thereto based on the angular spacing.

DESCRIPTION OF THE PREFERRED EMBODIMENT

Theory of Operation

Figure 3:
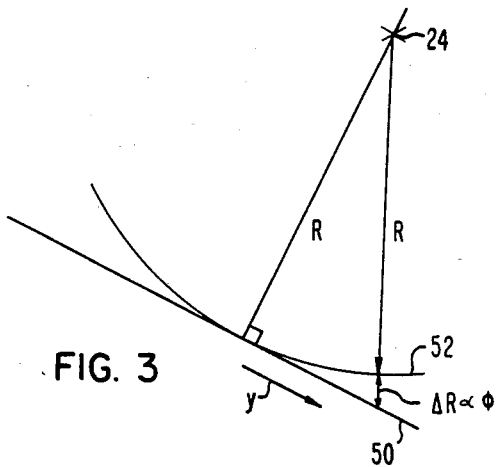
FIG. 3 is a simple diagram illustrating the differences between the nearly planar phase fronts resulting from recommended ranges and the curved phase fronts resulting from shorter range measurements.

If the range length at the test site is even a fraction of $D^2/\lambda$, the error effect is a gradual phase variation across the antenna aperture. This is shown by the simple diagram of FIG. 3. The planar phase front for recommended ranges is denoted by the straight line 50 and the curved phase front resulting from the shorter range measurements is denoted by the curved line 52. For the present example, the curved phase front 52 is assumed to be parabolic in shape producing a parabolic phase error $\phi$ across the aperture distance x of the antenna. Note that the antenna pattern effects disappear very rapidly away from the main beam which suggests that a complete transformation as described in the Background section hereabove is not necessary.

Figure 2:
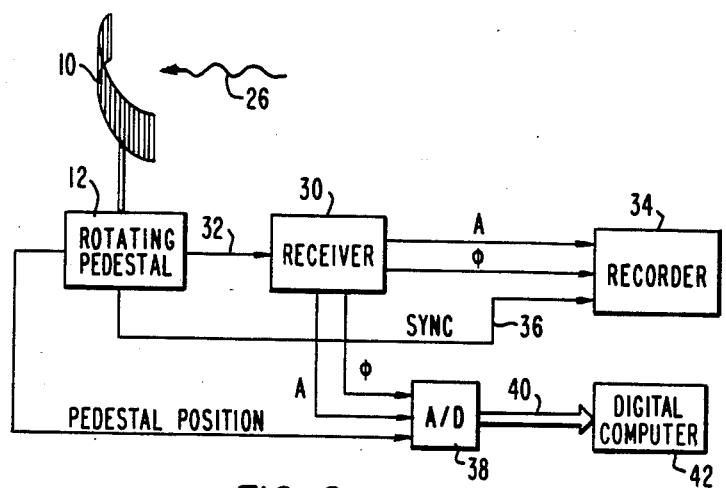
FIG. 2 is a block diagram schematic of apparatus suitable for taking antenna field measurements used to form the far-field beam pattern of an antenna under test in accordance with the inventive method.
Figure 4:
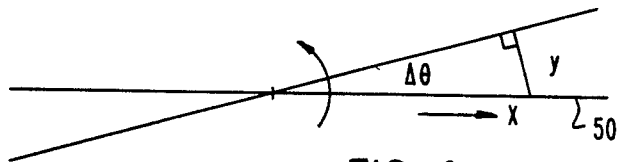
FIG. 4 is a simple diagram illustrating the changing of the phase front as an antenna turns through an incremental angle $\Delta\theta$.

The parabolic phase error $\phi$ may be expressed mathematically as follows:

$$\phi = (2\pi/\lambda)(\sqrt{R^2 + y^2} - R) \quad (1)$$

where $y = x\cos\theta$ is the projection of the antenna width on a plane normal to the range axis. This expression may be approximated as $\pi(X\cos\theta)^2/R\lambda$. As the antenna turns through an incremental angle $\delta\theta$, as shown by the simple diagram of FIG. 4, a discrete antenna field measurement may be taken using apparatus similar to that described in connection with the embodiment of FIG. 2. The actual field measurement for the incremental angle $\Delta\theta$ may be expressed mathematically as follows:

$$E_m(\theta) = \int_{-x/2}^{x/2} g(x) \exp[-j2\pi(X\cos\theta\sin\theta + (X\cos\theta)^2/2R)/\lambda]\,dx. \quad (2)$$

where $g(x)$ is the complex voltage distribution across the aperture of the antenna and $\lambda$ is the carrier wavelength of the signaling received from a source 24 located at a near-field range R away from the antenna under test. Letting, $f(x) = g(x)\exp(-j\pi(x\cos\theta)^2/R\lambda)$ in eq. (2), then $$E_m(\theta) = \int_{-x/2}^{x/2} f(x) \exp(j2\pi X \sin\theta/\lambda)\,dx. \quad (3)$$

The desired far-field antenna beam pattern may be expressed as:

$$E_o(\theta) = \int_{-x/2}^{x/2} g(x) \exp(-j2\pi X \sin\theta/\lambda)\,dx. \quad (4)$$

Substituting $f(x)\exp(j\pi(X\cos\theta)^2/R\lambda)$ for $g(x)$ in eq. (4), the following expression for the far-field pattern is obtained:

$$E_o(\theta) = \int_{-x/2}^{x/2} f(x)\exp(j2\pi X \sin\theta/\lambda)\exp(j\pi(X\cos\theta)^2/R\lambda)\,dx. \quad (5)$$

Comparing eq. (3) with eq. (5) shows that the term $\exp(j\pi(X\cos\theta)^2/R\lambda)$ modifies the actual near-field range used in the measurements into the desired field measurement.

The term $\exp(j\pi(X\cos\theta)^2/R\lambda)$ may be expanded into a cosine form by a series expansion which is mathematically expessed as:

$$\exp(j\pi(X\cos\theta)^2/R\lambda) = k_o + \sum_{n=1}^{\infty} k_n[\exp(jncx) + \exp(-jncx)], \quad (6)$$

where $$C = \sqrt{\pi/R\lambda} \cos\theta, \quad (7)$$

and $k_i$, for $i = 0$ to N are complex coefficients.

Substituting the expansion of equation (6) above for say $n = 2$, for example, into equation (5), we obtain:

$$E_o(\theta) = k_o \int_{-x/2}^{x/2} f(x) \exp(j2\pi X \sin\theta/\lambda)\,dx + \\ k_1 \int_{-x/2}^{x/2} f(x) \exp(j2\pi X \sin\theta/\lambda) \cdot \exp(jcx)\,dx + \\ k_1 \int_{-x/2}^{x/2} f(x) \exp(j2\pi X \sin\theta/\lambda) \cdot \exp(-jcx)\,dx + \\ k_2 \int_{-x/2}^{x/2} f(x) \exp(j2\pi X \sin\theta/\lambda) \cdot \exp(j2cx)\,dx + \quad (8)$$

-continued $$k_2 \int_{-x/2}^{x/2} f(x) \exp(j2\pi \times \sin\theta/\lambda) \cdot \exp(-j2cx) \, dx.$$

Recognizing that $$E_m(\theta) = \int_{-x/2}^{x/2} f(x) \exp(j2\pi \sin\theta/\lambda) \, dx$$

from equation (3) and that the term exp (jcx) is merely a linear phase front tilt or shift in angle, i.e. $d\theta$, across the antenna, it is realized that the terms of equation (8) are the actually measured beam pattern $E_m(\theta)$ multiplied by a constant $k_o$ and the measured beam pattern $E_m(\theta)$ steered off its center by $\Delta\theta$ and integer multiples thereof multiplied by their corresponding constants $k_n$.

Accordingly, from the above results, it is determined that discrete values of the far-field beam pattern may be derived for certain incremental angles $\Delta\theta$ along the angular rotation of the antenna by combining displaced and weighted actual antenna field measurements about the corresponding angle increment.

It is further recognized that antenna field measurements taken at or near the phase angles $d\theta$ may be used in deriving the discrete values of the far-field beam pattern during the angular rotation of the antenna, i.e., substantially in real time. Since the finite or near-field range effect dies out rapidly off-axis, only the terms of the above series with slight displacement are significant.

The incremental steering angle phase $d\theta$ may be determined by the following well-known expression:

$$nc = \text{phase slope} = (2\pi/\lambda)\sin\theta \quad (9)$$

Taking derivations of both sides $$\Delta(nc)/\Delta n = C = (2\pi/\lambda)\cos\theta \, \Delta\theta/\Delta n, \quad (10)$$

Substituting for c from eq. (7) and solving for $\Delta\theta$ when $\Delta n = 1$, the incremental phase angle becomes:

$$\Delta\theta = \sqrt{\lambda/4\pi R} \, . \quad (11)$$

For the above solution of the incremental phase angle, the complex constants $k_n$ for a five term series expansion (see eq. 6) may be determined using standard mathematical techniques as:

$$\left.\begin{array}{l}k_0 = -1.7708 - j\,3.4028 \\ k_1 = \phantom{-}1.7334 + j\,3.2334 \\ k_2 = -0.2417 + j\,1.9667 \\ k_3 = -0.1334 + j\,0.4746 \\ k_4 = \phantom{-}0.0271 - j\,0.0399\end{array}\right\} \quad (12)$$

Note that as the range R increases, the beam displacement $\Delta\theta$ approaches zero from the above expression (11). For example, at $R = D^2/\lambda$, the angle increment is about a quarter beam width. In practice, it is recognized that as the actual measured antenna field $E_m(\theta)$ is being recorded, a multiplicity of field measurements spaced $\Delta\theta$ apart may be multiplied by corresponding complex constants $k_n$ and summed to give the far-field beam pattern of the antenna in accordance with eq. (8). The field measurement spacing $\Delta\theta$ may be calculated in expression (8) for the range R and carrier wavelength $\lambda$ used; and the constants $k_n$ are fixed.

Method of Operation

Figure 1:
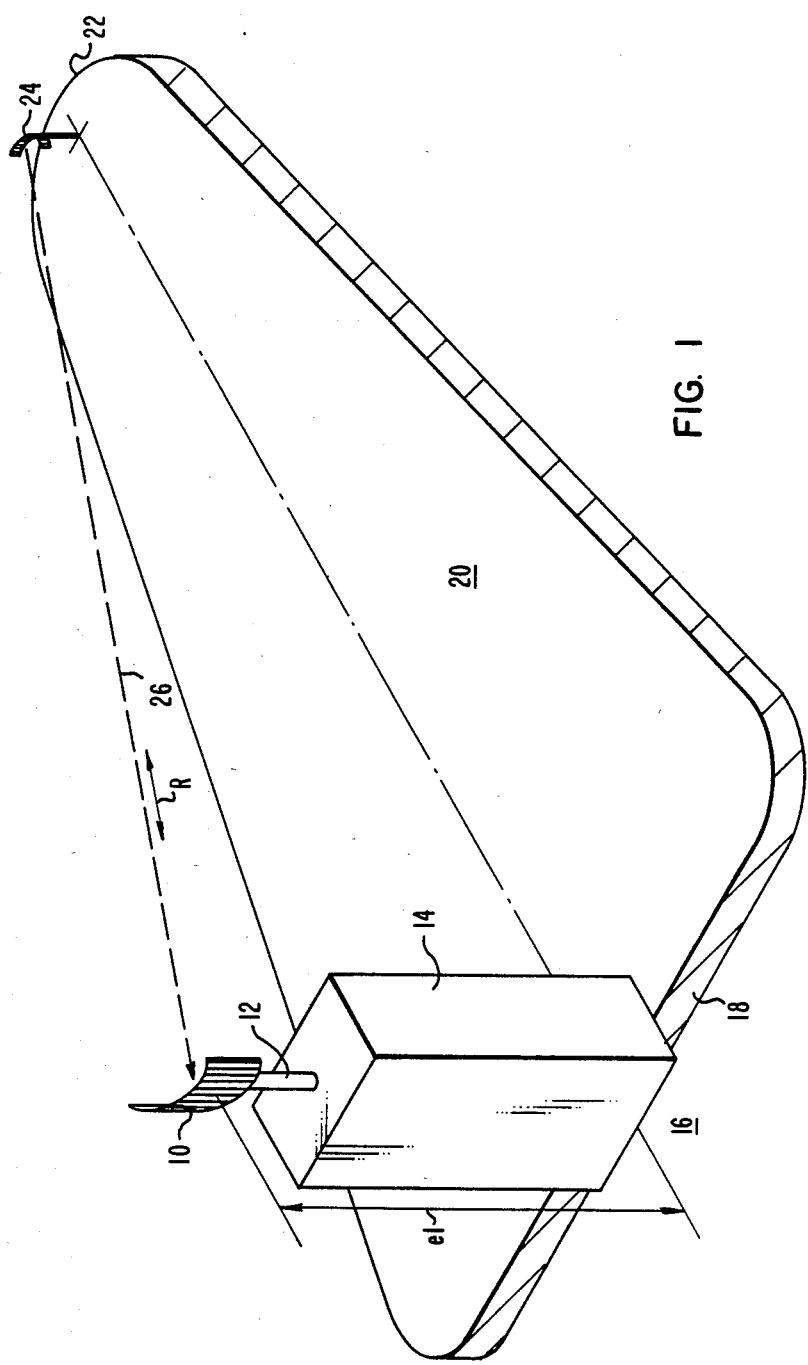
FIG. 1 is an illustration of an exemplary site for testing radar antennas.

A method of determining the far-field beam pattern of an antenna from antenna field measurements taken at a near-field range will be described utilizing the theoretical basis previously described. Referring to FIG. 1, the antenna 10 is caused to receive radar signaling having a carrier wavelength $\lambda$ from a source, such as the transmitting antenna 24, for example, located at a near-field range R away from the antenna 10. The beam pattern of the antenna 10 may be rotated through a rotational angle about the line-of-sight 26 of the source of the radar signaling. Measurements of the field of the antenna 10 may be taken at predetermined angular increments during the rotation thereof utilizing similar apparatus as that described in connection with the embodiment of FIG. 2.

The far-field beam pattern of the antenna 10 may be formed by deriving discrete values $E_0(\theta)$ thereof for corresponding angle increments $\Delta\theta$ along the angular rotation of the antenna. Each discrete value may be derived as a function of a multiplicity of actual antenna field measurements taken about the angle increment corresponding thereto. The example, in FIG. 5, points 60–65 on the dashed line 70 represent examples of antenna field measurements at a short range that may be taken for various predetermined angle increments during the rotation of the antenna about the source of radar signaling. These exemplary field measurements 60–65 include the phase errors as a result of the curved phase front phenomenon as described in connection with FIG. 3. If we assume an approximation using three coefficients $k_0$, $k_1$, and $k_2$ (i.e., five beams), and the measurements 60–65 are spaced at $\Delta\theta$ or some spacing close to $\Delta\theta$, then these exemplary antenna field measurements 60–65 may be utilized to compute the discrete value 72 of the approximated far-field beam pattern represented by the short dashed line 74 in the graph in FIG. 5. This method may be continued for each incremental angle of the antenna rotation to form the approximate far-field beam pattern exemplified by the curve 74. The actual far-field beam pattern at infinite range is shown by the solid line 76.

Figure 5:
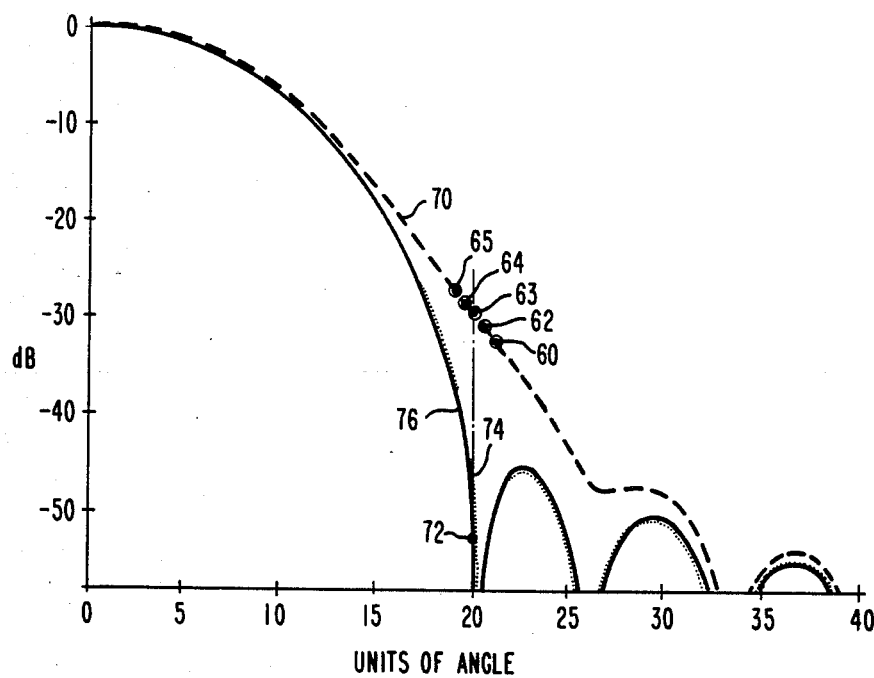
FIG. 5 is a graph illustrating both corrected and uncorrected beam pattern results with an ultra-low side lobe antenna at a range of $D^2/\lambda$.

The foregoing described method may form the far-field beam pattern 74 as exemplified in FIG. 5 by deriving the discrete values 72 thereof during the angular rotation of the antenna, preferably, substantially at the angle increment correponding thereto (i.e., the derivation being performed substantially in real time). Note that the selected angle increments for the measurements, like 60–65, for example, are based on a function of the carrier wavelength $\lambda$ and the near-field range R, a preferred function of which being expressed in the above equation (11).

Experimental Results

Figure 6:
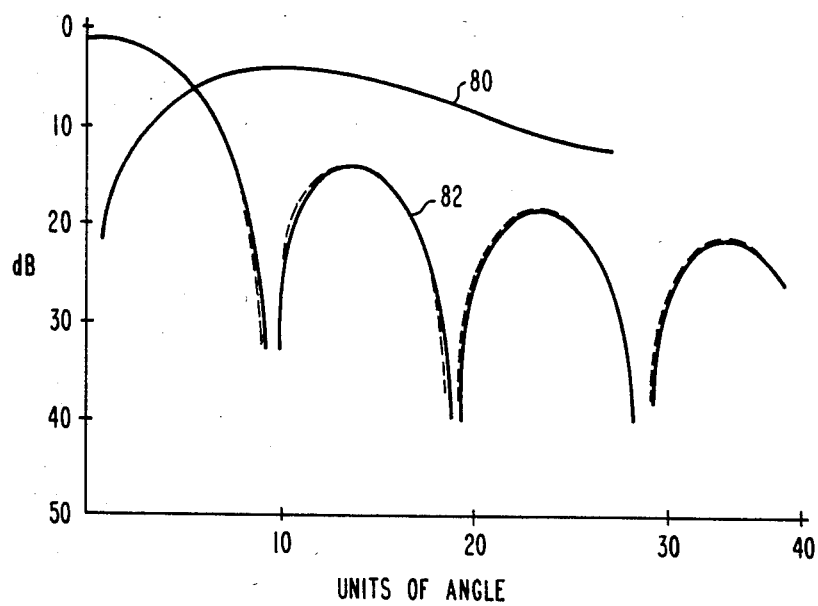
FIG. 6 is another graph which illustrates other types of antenna beam patterns.

The curve 74 of the graph depicted in FIG. 5 described above illustrates the result corresponding to an ultra-low side lobe antenna measured at a range of $D^2/\lambda$. The low edge taper for such ultra-low side lobe antennas makes the residual error even less significant. FIG. 6 is another graph which illustrates other types of antenna beam patterns such as a difference pattern shown by the solid line 80 and a uniformly illuminated antenna pattern shown by the solid line 82. The respective approximated beam patterns derived in accordance with the foregoing described method as shown by the dashed lines for comparison purposes. Note that for the difference beam pattern 80 the two patterns, that is, actual versus approximated, are indistinguishable.

Figure 7:
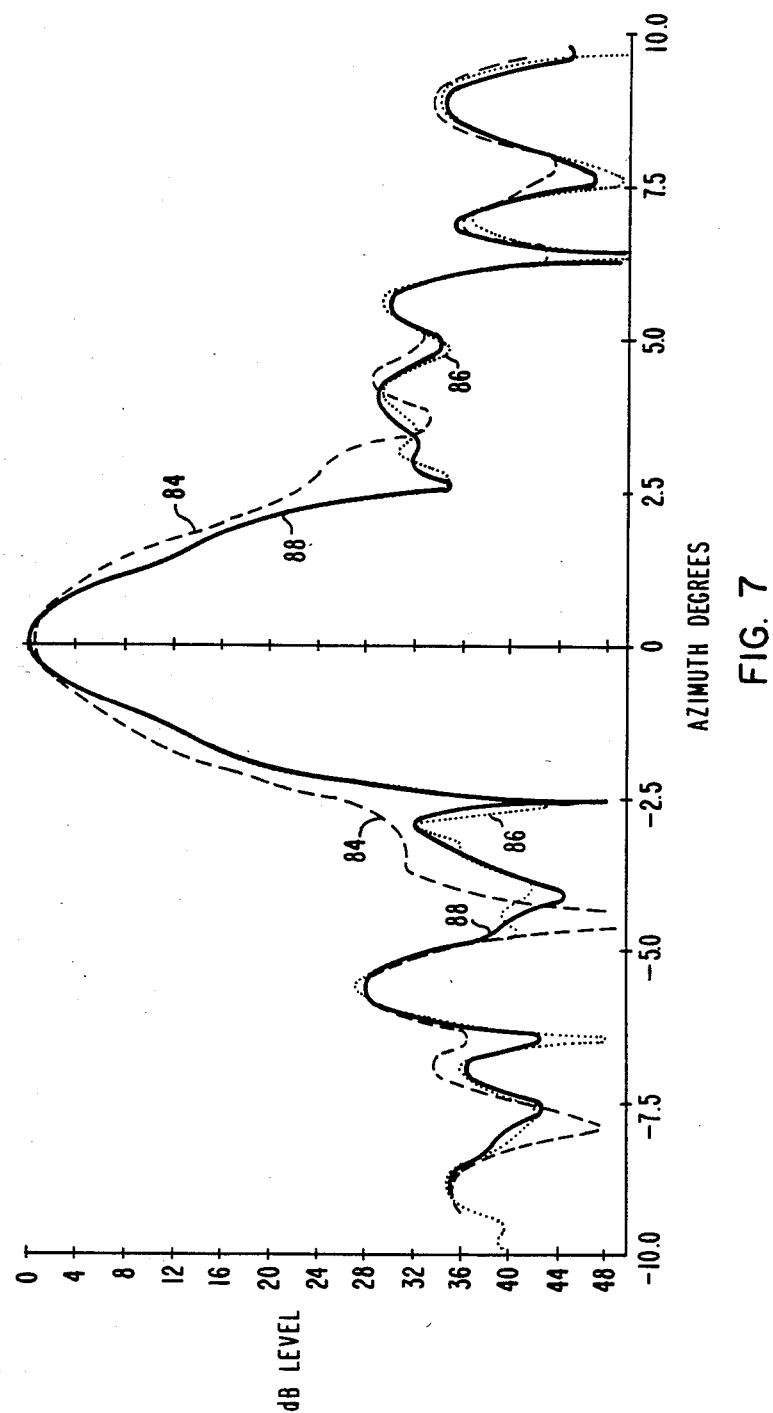
FIGS. 7, 8 and 9 are graphs depicting exemplary experimental results in forming the far-field beam patterns of two different antennas at various ranges using the inventive method.

In an experiment, a 42-foot wide antenna was tested at 1.3 gigahertz on a test site similar to that described in connection with FIG. 1. A first test was conducted at a range of approximately 5000 feet and another test was conducted using the elevation range of the antenna which was approximately 1700 feet. It is understood that there are unavoidable differences between the ranges besides the range length; nevertheless, the beam patterns were approximately with three coefficients $k_0$, $k_1$, and $k_2$ (i.e., five beams) and the formed far-field beam patterns thereof are depicted in the graph of FIG. 7. The long dashed line curve 84 is representative of the near-field antenna measurements at the elevated range over the azimuth rotation of the antenna which was approximately 20° about the line-of-sight of the radar signaling. The short dashed line curve 86 represents the formed far-field beam pattern for the 1700-foot range example. The solid line curve 88 represents the beam pattern actually measured for the 5000-foot range example.

Figure 8:
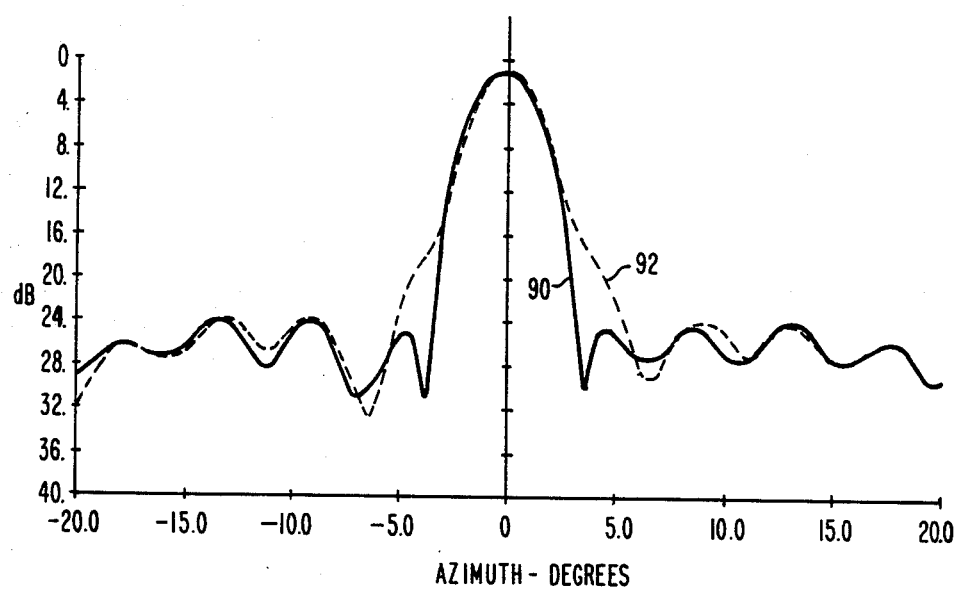
Figure 9:
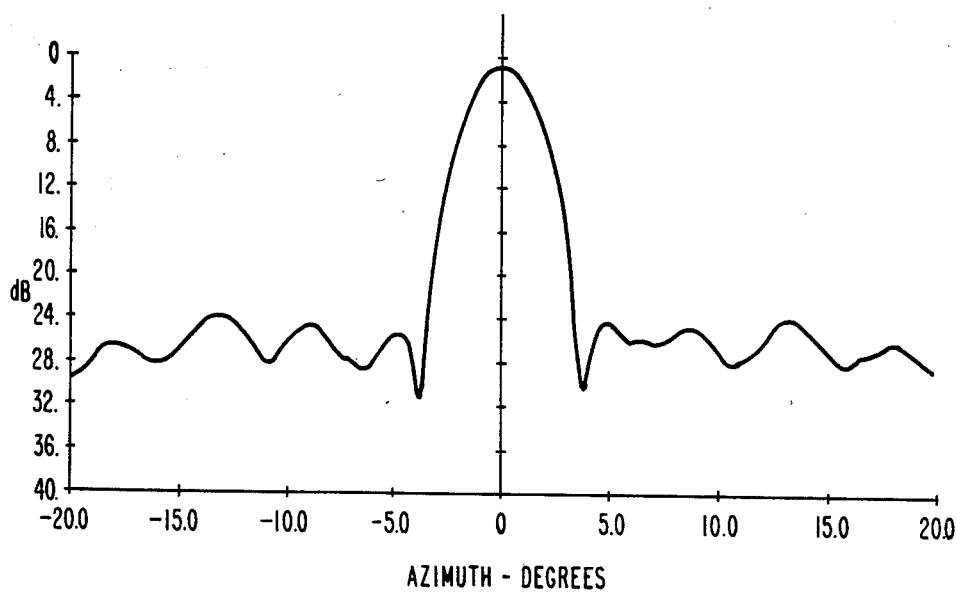

Another experiment was conducted with an 18-foot antenna which was tested at 1.3 gigahertz on a different pair of range that were 4000 feet (11 $D^2/\lambda$) and 315 feet (0.9 $D^2/\lambda$) in length. The actual field measurement patterns corresponding to these two ranges are depicted by the curves 90 and 92, respectively, in the graph of FIG. 8 with the characteristic spread in the base beam width. In forming the far-field beam pattern corresponding to the 315-foot range, five coefficients or nine beams were used in accordance with the methods described hereabove. The formed far-field beam pattern derived is shown in the graph of FIG. 9. In comparing the graphs of FIG. 8 and 9, any residual differences are not believed due to the technique used; rather it is suspected that since the 315-foot range was never intended for such a large antenna, i.e., 18-foot, it may require some redesign of the transmit dish thereof.

In summary, both the theoretical calculations and experimental tests indicated that an approximate far-field beam pattern may be formed which is valid and useful for near-field ranges. It is felt that even a 4-to-1 reduction from the adequate ranges referred to hereabove is very significant since it reduces the controlled area of the test site by actually 16-to-1, that is, to a size that most sites can provide. While it requires the measuring of complex antenna beam pattern voltages, it allows the simplest of computer method derivations with little storage and very few steps to form the desired far-field antenna beam pattern. In addition, it is proposed that the beam formation process is simple and fast enough to form the discrete values of the far-field beam pattern substantially in real time at or close to the corresponding angle increments thereof.

I claim:

1. A method of determining the far-field beam pattern of an antenna from antenna field measurements taken at a short range, said method comprising the steps of:

causing said antenna to receive radar signaling having a carrier wavelength $\lambda$ from a source located at a short range R away from said antenna;

rotating said antenna beam pattern through a rotational angle about the line-of-sight of said source of radar signaling;

taking measurements of the field of said antenna at predetermined angular increments during said rotation thereof; and forming the far-field beam pattern of said antenna by deriving discrete values thereof for corresponding angle increments along said angular rotation, each discrete value derived as a function of a multiplicity of antenna field measurements taken about the angle increment corresponding thereto, said multiplicity being substantially less than the full spectrum of antenna field measurements corresponding to said angular rotation; whereby method steps of transforming the near-field beam pattern measurements to an antenna aperture distribution to remove phase curvature effects and inverse transforming the corrected aperture distribution to form the desired far-field beam pattern are avoided.

2. The method in accordance with claim 1 wherein the step of forming the far-field beam pattern of the antenna is performed by deriving the discrete values of the pattern during the angular rotation of the antenna.

3. The method in accordance with claim 2 wherein each discrete value of the far-field beam pattern is derived substantially at the angle increment corresponding thereto during the rotation of the antenna.

4. The method in accordance with claim 1 wherein the step of forming includes the steps of:

selecting the angle increments along the antenna rotation for which discrete values of the antenna beam pattern are to be derived based on an angular spacing which is a function of the carrier wavelength $\lambda$ and the short range R; and selecting the multiplicity of antenna field measurements used in the derivation of each discrete value of the beam pattern about the angular increment corresponding thereto based on said angular spacing.

5. The method in accordance with claim 4 wherein the angular spacing $\Delta\theta$ is determined in accordance with the following expression:

$$\Delta\theta = \sqrt{\lambda/4\pi R} .$$

6. The method in accordance with claim 4 wherein the step of forming includes the steps of:

selecting n antenna field measurements about each selected angular increment based on said angular spacing; and deriving the discrete beam pattern value correponding to each selected angular increment as the weighted summation of the selected n antenna field measurements associated therewith.

7. The method in accordance with claim 6 wherein the step of deriving each discrete beam pattern value is performed as the n selected antenna field measurements are taken during the rotation of the antenna.

* * * * *